(12) United States Patent
Avitan

(10) Patent No.: US 8,803,556 B1
(45) Date of Patent: Aug. 12, 2014

(54) METHOD AND APPARATUS FOR COMPARING SIGNALS

(71) Applicant: Marvell Israel (M.I.S.L.) Ltd., Yokneam (IL)

(72) Inventor: Shimon Avitan, Kirywat Ata (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 31 days.

(21) Appl. No.: 13/669,265

(22) Filed: Nov. 5, 2012

Related U.S. Application Data

(60) Provisional application No. 61/557,811, filed on Nov. 9, 2011.

(51) Int. Cl.
*H03K 5/22* (2006.01)

(52) U.S. Cl.
USPC .............................................. 327/63; 327/90

(58) Field of Classification Search
USPC ...................................................... 327/63–90
See application file for complete search history.

(56) References Cited

U.S. PATENT DOCUMENTS

| | | | | |
|---|---|---|---|---|
| 3,906,346 | A * | 9/1975 | Hunter | 377/20 |
| 7,250,807 | B1 * | 7/2007 | Doyle | 327/534 |
| 8,400,189 | B2 * | 3/2013 | Moon | 327/77 |
| 2009/0083568 | A1 * | 3/2009 | Namiki | 713/502 |

* cited by examiner

*Primary Examiner* — Quan Tra

(57) ABSTRACT

Some of the embodiments of the present disclosure provide a method comprising receiving a first signal and a second signal; generating a first digital count corresponding to a characteristic of the first signal; subsequent to generating the first digital count, generating a second digital count corresponding to a characteristic of the second signal; and comparing the first digital count with the second digital count. Other embodiments are also described and claimed.

16 Claims, 4 Drawing Sheets

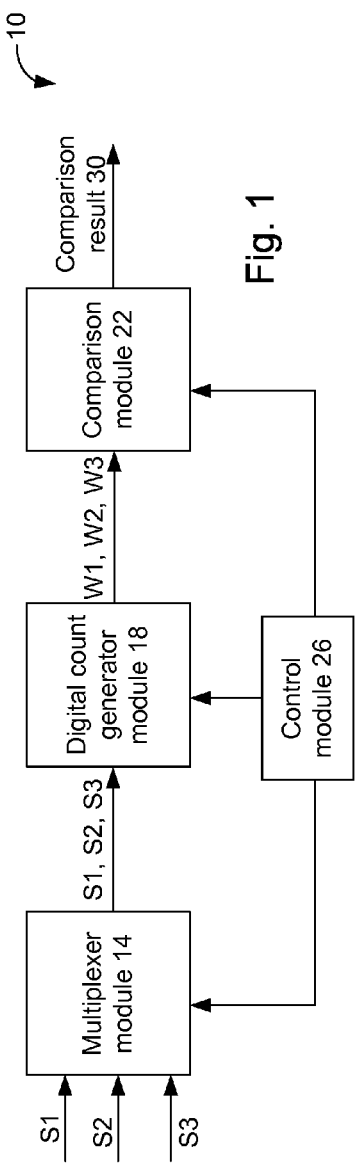
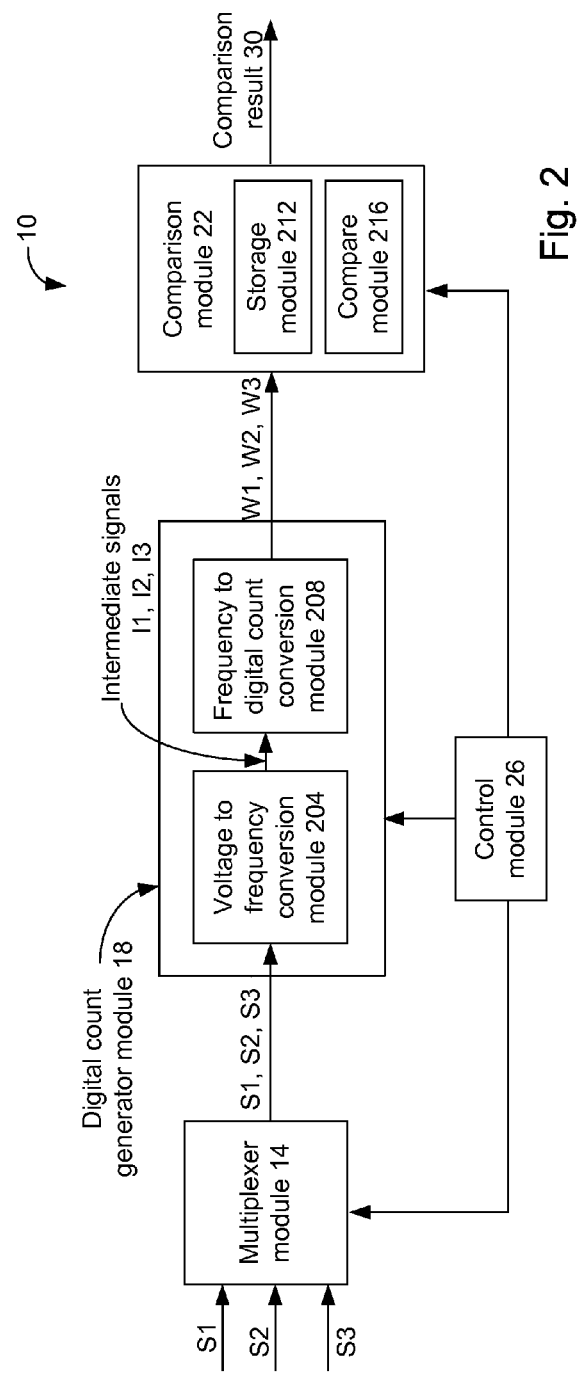

METHOD AND APPARATUS FOR COMPARING SIGNALS

CROSS REFERENCE TO RELATED APPLICATIONS

The present disclosure claims priority to U.S. Provisional Patent Application No. 61/557,811, filed on Nov. 9, 2011, which is incorporated herein by reference.

TECHNICAL FIELD

Embodiments of the present disclosure relate to electronic circuits, and more particularly, to methods and apparatus for comparing signals.

BACKGROUND

Unless otherwise indicated herein, the approaches described in this section are not prior art to the claims in the present disclosure and are not admitted to be prior art by inclusion in this section.

A comparator compares characteristics of two or more signals, such as their respective voltage levels. For example, the comparator receives the two signals, compares the two signals, and determines which of the two signals has a higher voltage level. In a conventional comparator, two different circuit paths are respectively used for the two signals during the comparison operation. In such a conventional comparator, manufacturing or process variation in the two different circuit paths can adversely affect the comparison result.

SUMMARY

In various embodiments, the present disclosure provides a method comprising receiving a first signal and a second signal; generating a first digital count corresponding to a characteristic of the first signal; subsequent to generating the first digital count, generating a second digital count corresponding to a characteristic of the second signal; and comparing the first digital count with the second digital count. Other embodiments are also described and claimed. In an embodiment, the method comprises, in response to the first digital count being higher than the second digital count, determining that the characteristic of the first signal is higher than the characteristic of the second signal; and in response to the first digital count being lower than the second digital count, determining that the characteristic of the first signal is lower than the characteristic of the second signal.

In an embodiment, there is also provided an apparatus comprising a digital count generator module configured to (i) generate a first digital count corresponding to a characteristic of a first signal, and (ii) subsequent to generating the first digital count, generate a second digital count corresponding to the characteristic of a second signal; and a comparison module configured to compare the first digital count with the second digital count. In an embodiment, the comparison module is further configured to, in response to the first digital count being higher than the second digital count, determine that the characteristic of the first signal is higher than the characteristic of the second signal; and in response to the first digital count being lower than the second digital count, determine that the characteristic of the first signal is lower than the characteristic of the second signal.

In an embodiment, there is also provided a method comprising receiving a first signal and a second signal; generating a first intermediate signal having a first frequency such that the first frequency is proportional to a voltage level of the first signal; counting a number of rising edges of the first intermediate signal during a first time window to generate a first digital count; subsequent to generating the first digital count, generating a second intermediate signal having a second frequency such that the second frequency is proportional to a voltage level of the second signal; counting a number of rising edges of the second intermediate signal during a second time window to generate a second digital count such that a time duration of the first time window is substantially same as a time duration of the second time window; comparing the first digital count with the second digital count; and based on comparing the first digital count with the second digital count, determining whether the voltage level of the first signal is higher than the voltage level of the second signal.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIG. 1 schematically illustrates an example implementation of a comparison system configured to compare a plurality of signals.

FIG. 2 illustrates an example implementation of the comparison system of FIG. 1 in more detail.

DETAILED DESCRIPTION

Figure 3:
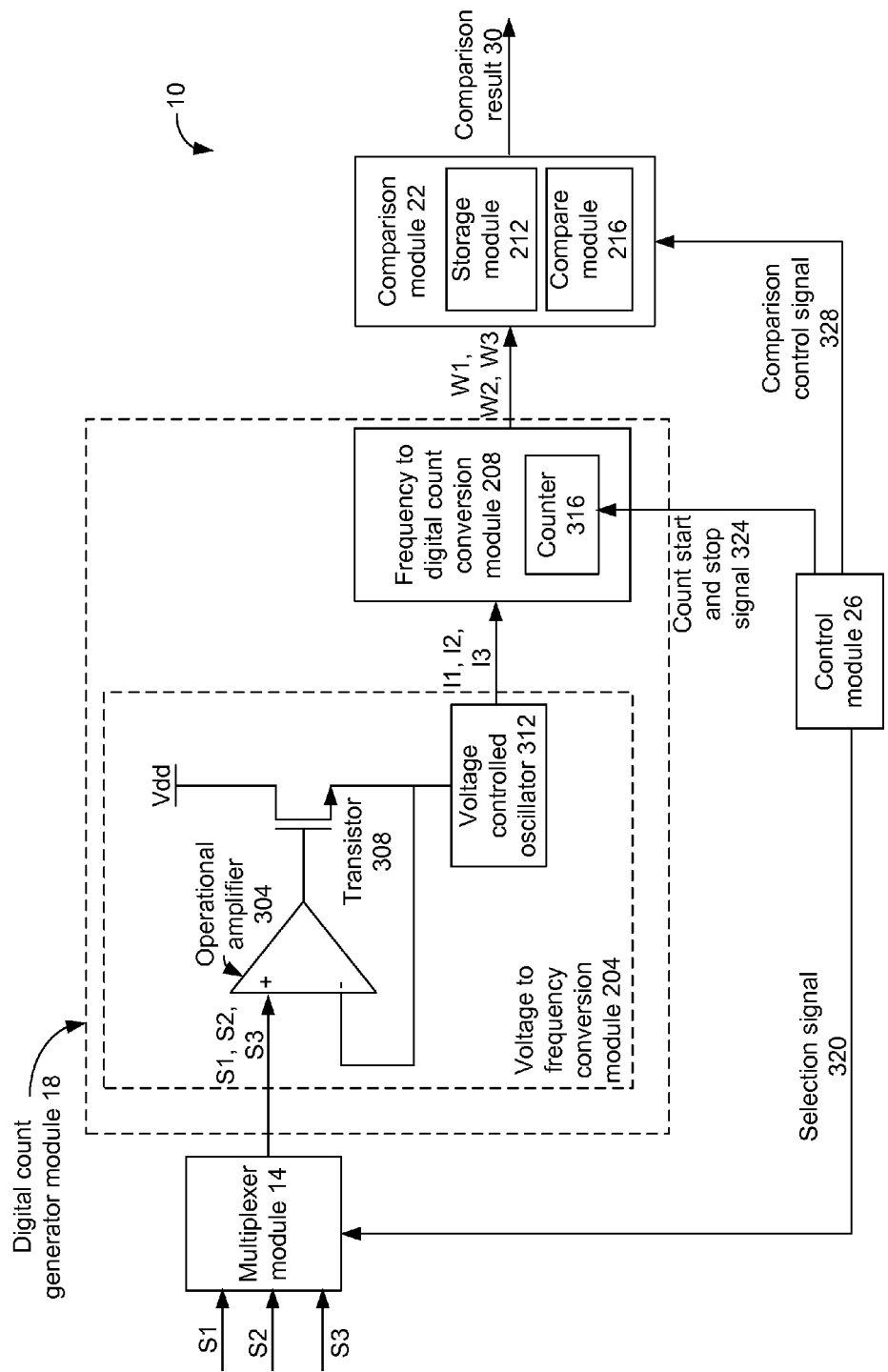
FIG. 3 illustrates an example implementation of the comparison system of FIGS. 1 and 2 in more detail.

FIG. 1 schematically illustrates a comparison system 10 (henceforth referred to as "system 10") configured to compare a plurality of signals. The system 10 receives signals S1, S2 and S3. In an embodiment, the system 10 comprises a multiplexer module 14 configured to receive the signals S1, S2 and S3. At any given time, the multiplexer module 14 selectively outputs any one of the signals S1, S2 and S3, based on a control signal received from a control module 26 included in the system 10. For example, during a first time period, the multiplexer module 14 outputs the signal S1; during a second time period, the multiplexer module 14 outputs the signal S2; and during a third time period, the multiplexer module 14 outputs the signal S3.

The system 10 also comprises a digital count generator module 18 configured to receive the output of the multiplexer module 14. For example, during the first time period, the digital count generator module 18 receives the signal S1; during the second time period, the digital count generator module 18 receives the signal S2; and during the third time period, the digital count generator module 18 receives the signal S3. The digital count generator module 18 generates a digital count W1 based on the signal S1; generates a digital count W2 based on the signal S2; and generates a digital count W3 based on the signal S3. In an embodiment, each of the digital counts W1, W2 and W3 are respectively proportional to a characteristic of the signals S1, S2 and S3. Thus, each of the digital counts W1, W2 and W3 are digital representations of the characteristic of the signals S1, S2 and S3, respectively. In an example, the characteristic of the signals S1, S2 and S3 is the voltage levels of the signals S1, S2 and S3, and each of the digital counts W1, W2 and W3 are respectively proportional to voltage levels of the signals S1, S2 and S3. For example, if the voltage level of the signal S1 is higher than the voltage level of the signal S2, then the digital count W1 is higher than the digital count W2. In another example, the characteristic of the signals S1, S2 and S3 is the frequencies of the signals S1, S2 and S3, and each of the digital counts W1, W2 and W3 are respectively proportional to the frequencies of the signals S1, S2 and S3.

The system 10 also comprises a comparison module 22 configured to receive the digital counts W1, W2 and W3, and compare the digital counts W1, W2 and W3. Based on comparing the digital counts W1, W2 and W3, the comparison module is configured to output the comparison result 30. In an embodiment, the comparison result 30 provides a comparison of the characteristic of the signals S1, S2, S3. For example, in response to the digital count W1 being higher than the digital count W2, the comparison result 30 indicates that the characteristic (e.g., the voltage level) of the signal S1 is higher than that of the signal S2. In another example, in response to the digital count W1 being lower than the digital count W2, the comparison result 30 indicates that the characteristic (e.g., the voltage level) of the signal S1 is lower than that of the signal S2.

Thus, the system 10 of FIG. 1 receives the signals S1, S2 and S3; generates digital counts W1, W2 and W3 corresponding to a characteristic of the signals S1, S2 and S3, respectively; compares the digital counts W1, W2 and W3; and based on the comparison, generates the comparison result 30 that indicates the relative values of the characteristic of the signals S1, S2 and S3. In an example, the characteristic of the signals S1, S2 and S3 is the voltage level of the signals S1, S2 and S3, and the comparison result 30 indicates, for example, which of the signals S1, S2 and S3 has the highest voltage level (and/or which of the signals S1, S2 and S3 has the lowest voltage level) among the signals S1, S2 and S3.

In an embodiment, a same circuit path in the digital count generator module 18 is used to generate the digital counts W1, W2 and W3 corresponding to the signals S1, S2 and S3, respectively. For example, the circuit path used to process the signal S1 to generate the digital count W1 is also subsequently used to process the signal S2 to generate the digital count W2. Accordingly, various manufacturing and/or process variations in the digital count generator module 18 affects the generation of the digital counts W1, W2 and W3 in a similar manner. Furthermore, as the processing of the signals S1, S2 and S3 are performed one after another in rapid succession (i.e., in close time proximity), a temperature variation in the circuit path or in the ambience (or, for example, a variation in a supply voltage in the circuit path) affect the generation of the digital counts W1, W2 and W3 in a similar manner. Thus, the comparison result 30 is not affected by any manufacturing or process variation, temperature variation, and/or supply voltage variation in the digital count generator module 18. In contrast, in a conventional comparator used for comparing two signals, two different circuit paths are respectively used for the two signals during the comparison operation. Accordingly, in such a conventional comparator, manufacturing or process variation in the two different circuit paths can adversely affect the comparison result.

Although FIG. 1 illustrates the system 10 receiving and comparing only three signals S1, S2 and S3, in other embodiments, the system 10 can receive and compare any different number of signals.

FIG. 2 illustrates an example implementation of the system 10 of FIG. 1 in more detail, according to an embodiment. In the example implementation of FIG. 2, the characteristic of the signals S1, S2 and S3 compared by the system 10 is the voltage levels of the signals S1, S2 and S3 (although in other implementations, any other appropriate characteristic of the signals S1, S2 and S3 (e.g., frequencies of the signals S1, S2 and S3) may be compared by the system 10).

Referring to FIGS. 1 and 2, in an embodiment, the digital count generator module 18 comprises a voltage to frequency conversion module 204. The voltage to frequency conversion module 204 receives the signals S1, S2 and S3 in series from the multiplexer 14, and generates intermediate signals I1, I2 and I3 based respectively on the signals S1, S2 and S3. In an embodiment, a frequency of each of the intermediate signals I1, I2 and I3 is respectively proportional to the voltage level of the signals S1, S2 and S3. For example, the intermediate signal I1 has a frequency f1, which is proportional to a voltage level v1 of the signal S1; the intermediate signal I2 has a frequency f2, which is proportional to a voltage level v2 of the signal S2; and the intermediate signal I3 has a frequency f3, which is proportional to a voltage level v3 of the signal S3.

The digital count generator module 18 also comprises a frequency to digital count conversion module 208 configured to receive the intermediate signals I1, I2 and I3. The frequency to digital count conversion module 208 is further configured to generate the digital counts W1, W2 and W3 based respectively on the intermediate signals I1, I2 and I3. Each of the digital counts W1, W2 and W3 are respectively proportional to the frequencies of the intermediate signals I1, I2 and I3. For example, the digital count W1 is proportional to the frequency f1 of the intermediate signal I1; the digital count W2 is proportional to the frequency f2 of the intermediate signal I2; and the digital count W3 is proportional to the frequency f3 of the intermediate signal I3.

The comparison module 22 comprises a storage module 212 and a compare module 216. As previously discussed, the multiplexer module 14 outputs the signals S1, S2 and S3 in series, and the digital count generator module 18 correspondingly outputs the digital counts W1, W2 and W3 in series. The storage module 212 receives and stores the digital counts W1, W2 and W3. In an embodiment, the storage module 212 comprises one or more registers (or an appropriate type of memory) to store the digital counts W1, W2 and W3.

Once the storage module 212 receives and stores the digital counts W1, W2 and W3, the compare module 216 compares the digital counts W1, W2 and W3 (e.g., determines which of the digital counts W1, W2 and W3 is highest, which of the digital counts W1, W2 and W3 is lowest, and/or the like). Based on the comparison, the compare module 216 outputs the compare result 30, which is indicative of the relative values of the voltage levels v1, v2 and v3 of the signals S1, S2 and S3.

FIG. 3 illustrates an example implementation of the system 10 of FIGS. 1 and 2 in more detail. Referring to FIGS. 1-3, the voltage to frequency conversion module 204 (which is illustrated in dotted lines in FIG. 3) comprises an operational amplifier 304 configured to receive the signals S1, S2 and S3 in series at a positive terminal of the operational amplifier 304. An output of the operational amplifier 304 is used to control a gate terminal of a transistor 308 of the voltage to frequency conversion module 204. In an embodiment, the transistor 308 is an N-channel Metal Oxide Semiconductor Field Effect Transistor (MOSFET), a drain terminal of which is coupled to a power supply Vdd and a source terminal of which is coupled to a negative terminal of the operational amplifier 304. The source terminal of the transistor 308 is also coupled to a voltage controlled oscillator 312. In an embodiment, the voltage controlled oscillator 312 may be implemented as a ring oscillator.

The operational amplifier 304 and the transistor 308 are coupled in a negative feedback loop, such that the voltage controlled oscillator 312 receives a signal that is proportional to the input of the operational amplifier 304. Thus, the voltage controlled oscillator 312 receives signals that are proportional the input of the operational amplifier 304. For example, in the embodiment illustrated in FIG. 3, the voltage controlled oscillator 312 receives signals that are equal to the input of the operational amplifier 304 (i.e., the voltage controlled oscillator 312 receives the signals S1, S2 and S3 in series).

For a given input to the voltage controlled oscillator 312, a frequency of the output of the voltage controlled oscillator 312 is specified and is based on (e.g., proportional to) the input to the voltage controlled oscillator 312. For example, the voltage controlled oscillator 312 generates the intermediate signals I1, I2 and I3 based on respectively receiving the signals S1, S2 and S3, such that the frequency of the intermediate signals I1, I2 and I3 is respectively proportional to the voltage levels of the signals S1, S2 and S3. For example, as previously discussed, the frequency f1 of the intermediate signal I1 is proportional to the voltage level v1 of the signal S1; the frequency f2 of the intermediate signal I2 is proportional to the voltage level v2 of the signal S2; and the frequency f3 of the intermediate signal I3 is proportional to the voltage level v3 of the signal S3.

Figure 4:
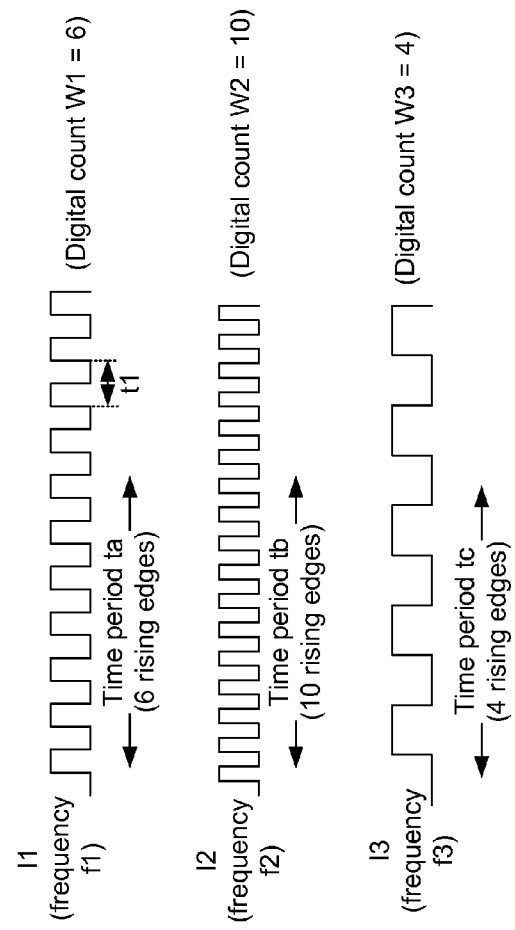
FIGS. 4a and 4b illustrate various signals of the comparison system of FIGS. 1-3.

FIGS. 4a and 4b illustrate various signals of the system 10 of FIGS. 1, 2 and 3. FIG. 4a illustrates example voltage levels v1, v2 and v3 of the signals S1, S2 and S3, respectively. In the example of FIG. 4a, the voltage level v2 of the signal S2 is higher than the voltage levels v1 and v3 of the signals S1 and S3, respectively; and the voltage level v1 of the signal S1 is higher than the voltage level v3 of the signal S3. As illustrated in FIG. 4a, the voltage levels of the signals S1, S2 and S3 are constant or are slowly varying with time (e.g., at least for the time during which the comparison operation of the signals S1, S2 and S3 is performed by the system 10).

FIG. 4b illustrates the intermediate signals I1, I2 and I3 generated by the voltage controlled oscillator 312, based respectively on the voltage levels v1, v2 and v3. For example, as the voltage level v2 is the highest among the voltage levels v1, v2 and v3, the frequency f2 of the intermediate signal I2 is the highest among the frequencies f1, f2 and f3 of the intermediate signals I1, I2 and I3, respectively, as illustrated in FIG. 4b. In another example, as the voltage level v3 is the lowest among the voltage levels v1, v2 and v3, the frequency f3 of the intermediate signal I3 is the lowest among the frequencies f1, f2 and f3 of the intermediate signals I1, I2 and I3, respectively, as illustrated in FIG. 4b.

Referring again to FIG. 3, the frequency to digital count conversion module 208 comprises a counter 316 configured to receive the intermediate signals I1, I2 and I3 in series. The counter 316 is configured to count a number of pulses of the intermediate signal I1 during, for example, a time period ta, to generate the digital count W1. For example, as illustrated in FIG. 4b, the counter 316 counts a number of rising edges of the intermediate signal I1 during the time period ta (e.g., as the number of rising edges of the intermediate signal I1 during the time period ta is indicative of the number of pulses of the intermediate signal I1 during the time period ta). The number of rising edges of the intermediate signal I1 during the time period ta is proportional to the frequency of the intermediate signal I1 (e.g., for a higher frequency f1 of the intermediate signal I1, the number of rising edges of the intermediate signal I1 during the time period ta will also be higher). For example, if a time period of the intermediate signal I1 is t1, then a number Na of rising edges of the intermediate signal I1 during the time period ta is given by Na=ta/t1. In an embodiment, the digital count W1 is equal to (or proportional to) the number of rising edges of the intermediate signal I1 counted during the time period ta by the counter 316.

In a similar manner, the counter 316 counts a number of pulses of the intermediate signal I2 (e.g., by counting a number of rising edge of the intermediate signal I2) during, for example, a time period tb, to generate the digital count W2; and counts a number of pulses of the intermediate signal I3 (e.g., by counting a number of rising edge of the intermediate signal I3) during, for example, a time period tc, to generate the digital count W3.

In an embodiment, the counter 316 starts and stops counting the intermediate signals I1, I2 and I3 based on a count start and stop signal 324 generated by the control module 26. In an embodiment, the control module 26 generates the count start and stop signal 324 such that the time periods ta, tb and tc are of substantially a same time duration.

In the example of FIG. 4b in which the frequency f2 is the highest and the frequency f3 is the lowest among the frequencies f1, f2 and f3, the counter 316 counts 6 rising edges of the intermediate signal I1 during the time period ta; counts 10 rising edges of the intermediate signal I2 during the time period tb; and counts 4 rising edges of the intermediate signal I3 during the time period tc. Accordingly, the digital counts W1, W2 and W3 have values of 6, 10 and 4, respectively, or values that are proportional to 6, 10 and 4, respectively (it is to be noted that the digital counts W1, W2 and W3 are, for example, binary numbers). As previously discussed, the digital counts W1, W2 and W3 are respectively indicative of the frequencies f1, f2 and f3 of the intermediate signals I1, I2 and I3, which are in turn respectively indicative of the voltage levels v1, v2 and v3 of the signals S1, S2 and S3.

The voltage values, frequencies and the digital counts illustrated in FIGS. 4a and 4b are mere examples, and do not limit the teachings of this disclosure. Although the counter 316 of FIG. 3 counts the number of pulses of the intermediate signals by counting a number of rising edges of the intermediate signals, in another embodiment, the counter 316 can count the number of pulses of the intermediate signals by another appropriate manner (e.g., by counting a number of falling edges of the intermediate signals).

As previously discussed, the storage module 212 receives and stores the digital counts W1, W2 and W3. Once the storage module 212 receives and stores each of the digital counts W1, W2 and W3, the compare module 216 compares the digital counts W1, W2 and W3 (e.g., based on receiving a comparison control signal 328 from the control module 26, which may indicate that each of the digital counts W1, W2 and W3 have been received and stored in the storage module 212). Based on the comparison, the compare module 216 outputs the compare result 30, which is indicative of the relative values of the voltage levels v1, v2 and v3 of the signals S1, S2 and S3 in the example embodiment. For example, in FIG. 4b, the digital counts W1, W2 and W3 are 6, 10 and 4, respectively. The compare module 216 compares these values of the digital counts W1, W2 and W3. Accordingly, the comparison result 30 indicates that the voltage level v2 of the signal S2 is the highest among the voltage levels of the signals S1, S2 and S3. Additionally or alternatively, the comparison result 30 indicates that the voltage level v3 of the signal S3 is the lowest among the voltage levels of the signals S1, S2 and S3.

As previously alluded to, each of the signals S1, S2 and S3 propagates through the same circuit path (e.g., comprising the voltage to frequency conversion module 204 and the frequency to digital count conversion module 208) while the digital counts W1, W2 and W3 are generated. Accordingly, a manufacturing or process variation in the voltage to frequency conversion module 204 affects the generation of the digital counts W1, W2 and W3 in a similar manner. For example, if the voltage controlled oscillator 312 has an offset or error, such an offset affects generation of each of the digital counts W1, W2 and W3 in a similar manner, such that the relative values of the digital counts W1, W2 and W3 are not affected by such an offset. Accordingly, the comparison result 30 is not affected by any manufacturing or process variation in the frequency conversion module 204 and/or the frequency to digital count conversion module 208. In contrast, in a conventional comparator used for comparing two signals, two different circuit paths are respectively used for the two signals during the comparison operation. Accordingly, in such a conventional comparator, manufacturing or process variation in the two different circuit paths can adversely affect a comparison result.

In an embodiment, a resolution of the system 10 may indicate how accurately the system 10 performs the comparison of the signals S1, S2 and S3. For example, it may be intended that the system 10 has an ability to distinguish a difference of 1 millivolt (mV) in the voltage levels of the signals S1, S2 and S3. To achieve such a resolution, the voltage controlled oscillator 312 has to be able to generate the intermediate signals with sufficient resolution (e.g., with fine granularity). For example, if the voltage level v2 is 1 mV higher than the voltage level v1, then the frequency f2 has to be sufficiently higher than f1 such that at least one more pulse of the intermediate signal I2 is detected within the time period tb compared to that of the intermediate signal I1. For example, the digital counts W1, W2, and W3 have to have a resolution of at least 2 significant bits (LSBs) per mV (i.e., 2 LSB/mV) to achieve a resolution of 1 mV for the system 10. Assume that the gain of the voltage to frequency conversion module 204 is K MHz/mV. As an example, K is 1 MHz/mV. That is, if the voltage level v2 is 1 mV higher than the voltage level v1, then the frequency f2 is higher than the frequency f1 by 1 MHz.

Assume that there are only two signals S1 and S2 (although such an assumption does not limit the teachings of this disclosure). Also, assume that ta=tb=T. The number of pulses of the intermediate signal I1 within the time period ta is given by Na=T·f1. Similarly, a number of pulses of the intermediate signal I2 within the time period tb is given by Nb=T·f2=T·(f1+K·(v2−v1)), where the frequency f2=(f1+K·(v2−v1)). Thus, the difference in (i) the number of pulses of the intermediate signal I1 within the time period ta and (ii) the number of pulses of the intermediate signal I2 within the time period tb is given by ΔN, where $$\Delta N = Nb - Na = T \cdot (f1 + K \cdot (v2 - v1)) - T \cdot f1 = T \cdot K \cdot (v2 - v1). \quad \text{Equation (1)}$$

Assume that the voltage v2 is higher than the voltage v1 by 1 mV (i.e., v2−v1=1 mV). As discussed before, assume that K is 1 MHz/mV. Thus, according to equation 1, in order to meet the 2 LSB/mV resolution, the time period T has to be 2 microseconds (μs). For example, if T is 2 μs, then ΔN=2 μs. 1 MHz/mV. 1 mV=2.

Accordingly, Equation 1 may be used to determine various operating parameters of the system 10 to achieve a desired resolution of the system 10. The resolution of the system 10 can be increased by, for example, increasing the time period T and/or by increasing the gain K of the voltage to frequency conversion module 204, as seen in Equation 1.

Figure 5:
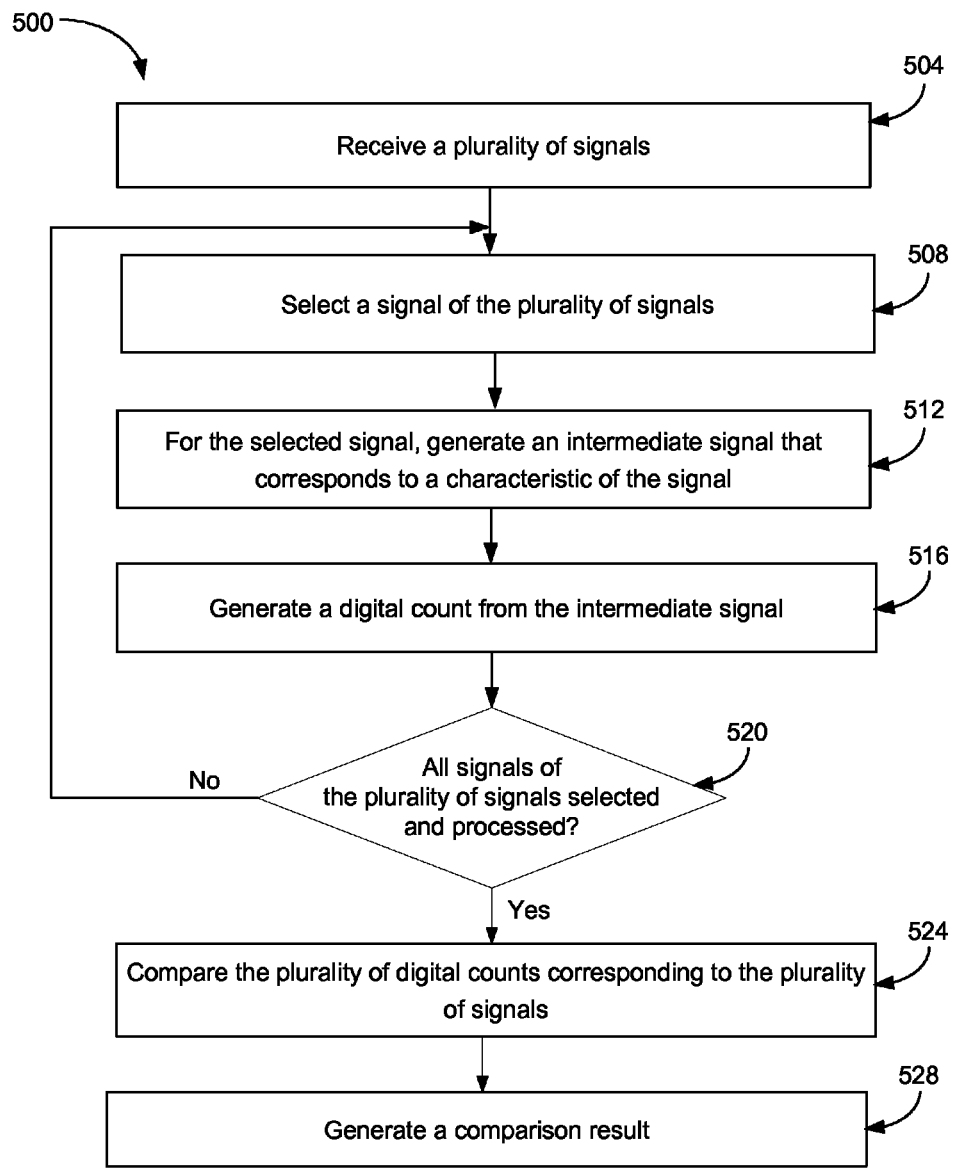
FIG. 5 illustrates an example method for operating the system of FIGS. 1-3.

FIG. 5 illustrates an example method 500 for operating the system 10 of FIGS. 1-3. At 504, a plurality of signals (e.g., signals S1, S2 and S3) are received (e.g., by the multiplexer module 14 of the system 10). At 508, a signal (e.g., S1) of the plurality of signals is selected (e.g., by the multiplexer module 14 in response to the selection signal 320). For example, the multiplexer module 14 outputs the plurality of signals serially, i.e., one after another, and 508 of the method 500 is directed towards outputting, by the multiplexer module 14, one of the plurality of signals. At 512, for the selected signal, an intermediate signal (e.g., intermediate signal I1) is generated (e.g., by the voltage to frequency conversion module 204). The generated intermediate signal corresponds to a characteristic of the selected signal. For example, a frequency of the generated intermediate signal is proportional to the characteristic (e.g., a voltage level) of the selected signal. At 516, a digital count (e.g., digital count W1) is generated from the intermediate signal (e.g., by the counter 316). The digital count is indicative of the frequency of the intermediate signal, which in turn is indicative of the characteristic (e.g., the voltage level) of the selected signal. In an embodiment and although not illustrated separately in FIG. 5, the digital count is stored in a memory or a storage module (e.g., the storage module 212).

At 520, a determination is made (e.g., by the control module 26) as to whether all the signals of the plurality of the signals have been selected and processed. If not (i.e., "No" at 520), then another signal (e.g., signal S2) is selected at 508 and the method loops back. If all the signals of the plurality of the signals have been selected and processed (i.e., "Yes" at 520), then at 524, the plurality of digital counts (e.g., digital counts W1, W2, W3) corresponding to the plurality of signals are compared (e.g., by the compare module 216, based on the comparison control signal 328). At 528, based on the comparison, a comparison result (e.g., comparison result 30) is generated. For example, in response to a first digital count of the plurality of digital counts being higher than a second digital count of the plurality of digital counts, the comparison result indicates that the characteristic of a first signal (e.g., which corresponds to the first digital count) of the plurality of signals is higher than the characteristic of a second signal (e.g., which corresponds to the second digital count) of the plurality of signals.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A method comprising:
receiving a first signal and a second signal;
generating a first digital count corresponding to a characteristic of the first signal, wherein generating the first digital count comprises (i) generating a first intermediate signal having a first frequency such that the first frequency is always proportional to the characteristic of the first signal, and (ii) counting a number of rising edges of the first intermediate signal during a first time window to generate the first digital count;
subsequent to generating the first digital count, generating a second digital count corresponding to a characteristic of the second signal, wherein generating the second digital count comprises (i) generating a second intermediate signal having a second frequency such that the second frequency is always proportional to the characteristic of the second signal, and (ii) counting a number of rising edges of the second intermediate signal during a second time window to generate the second digital count; and
comparing the first digital count with the second digital count.

2. The method of claim 1, further comprising:
in response to the first digital count being higher than the second digital count, determining that the characteristic of the first signal is higher than the characteristic of the second signal; and
in response to the first digital count being lower than the second digital count, determining that the characteristic of the first signal is lower than the characteristic of the second signal.

3. The method of claim 1, further comprising:
generating the first digital count corresponding to the characteristic of the first signal such that the first digital count of the first signal corresponds to a voltage characteristic of the first signal; and
generating the second digital count corresponding to the characteristic of the second signal such that the second digital count of the second signal corresponds to a voltage characteristic of the second signal.

4. The method of claim 1, wherein:
generating the first digital count further comprises generating the first digital count using a first circuit path;
generating the second digital count further comprises generating the second digital count using a second circuit path; and
the first circuit path and the second circuit path are a same circuit path.

5. The method of claim 1, further comprising:
multiplexing the first signal and the second signal to selectively output, at any given time, one of the first signal and the second signal,
wherein generating the first digital count further comprises (i) during a first time, multiplexing the first signal and the second signal to output the first signal, and (ii) in response to outputting the first signal, generating the first digital count using a circuit path, and
wherein generating the second digital count further comprises (i) during a second time that occurs subsequent to the first time, multiplexing the first signal and the second signal to output the second signal, and (ii) in response to outputting the second signal, generating the second digital count using the circuit path.

6. The method of claim 1, wherein comparing the first digital count with the second digital count further comprises:
storing the first digital count and the second digital count; and
comparing the stored first digital count with the stored second digital count.

7. The method of claim 1, wherein receiving the first signal and the second signal further comprises:
receiving the first signal and the second signal such that each of the first signal and the second signal are substantially time invariant.

8. The method of claim 1, further comprising:
receiving a third signal;
subsequent to generating the first digital count and the second digital count, generating a third digital count corresponding to a characteristic of the third signal; and
comparing the first digital count, the second digital count and the third digital count.

9. An apparatus comprising:
a digital count generator module configured to (i) generate a first digital count corresponding to a characteristic of a first signal, and (ii) subsequent to generating the first digital count, generate a second digital count corresponding to the characteristic of a second signal, wherein the digital count generator module comprises:
a voltage to frequency conversion module configured to (i) generate a first intermediate signal having a first frequency that is always proportional to the characteristic of the first signal, and (ii) generate a second intermediate signal having a second frequency that is always proportional to the characteristic of the second signal, and
a frequency to digital count conversion module configured to (i) count a number rising edges of the first intermediate signal during a first time window to generate the first digital count, and (ii) count a number rising edges of the second intermediate signal during a second time window to generate the second digital count; and
a comparison module configured to compare the first digital count with the second digital count.

10. The apparatus of claim 9, wherein the comparison module is further configured to:
in response to the first digital count being higher than the second digital count, determine that the characteristic of the first signal is higher than the characteristic of the second signal; and
in response to the first digital count being lower than the second digital count, determine that the characteristic of the first signal is lower than the characteristic of the second signal.

11. The apparatus of claim 9, further comprising:
a multiplexer module configured to (i) receive the first signal and the second signal, (ii) output, during a first time, the first signal to the digital count generator module, and (iii) output, during a second time that occurs subsequent to the first time, the second signal to the digital count generator module.

12. The apparatus of claim 9, wherein the digital count generator module is configured to (i) generate the first digital count such that the first digital count corresponds to a voltage characteristic of the first signal, and (ii) generate the second digital count such that the second digital count corresponds to a voltage characteristic of the second signal.

13. The apparatus of claim 9, wherein the voltage to frequency conversion module comprises a voltage controlled oscillator to generate (i) the first intermediate signal at the first frequency, and (ii) the second intermediate signal at the second frequency.

14. The apparatus of claim 9, wherein the comparison module is further configured to store the first digital count and the second digital count.

15. The apparatus of claim 9, wherein:
   the digital count generator module is further configured to, subsequent to generating the first digital count and the second digital count, generate a third digital count corresponding to the characteristic of a third signal; and
   the comparison module is further configured to compare the first digital count, the second digital count and the third digital count.

16. The apparatus of claim 9, further comprising:
   a multiplexer module configured to (i) receive the first signal and the second signal, (ii) output, during a first time, the first signal to the voltage to frequency conversion module, and (iii) output, during a second time that occurs subsequent to the first time, the second signal to the voltage to frequency conversion module,
   wherein the voltage to frequency conversion module comprises:
      an operational amplifier configured to (i) receive, during the first time, the first signal from the multiplexer, and (ii) receive, during the second time, the second signal from the multiplexer,
      a transistor configured to receive an output of the operational amplifier, and
      a voltage controller oscillator configured to (i) receive an output from the transistor, and (ii) generate the first intermediate signal and the second intermediate signal.

* * * * *